United States Patent
Verlinden et al.

(10) Patent No.: US 9,014,323 B2
(45) Date of Patent: Apr. 21, 2015

(54) CLOCK SYNCHRONIZER FOR ALIGNING REMOTE DEVICES

(71) Applicant: NXP B.V., Eindhoven (NL)

(72) Inventors: Jos Verlinden, Wachtendonk (DE); Remco Cornelis Herman van de Beek, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/015,197

(22) Filed: Aug. 30, 2013

(65) Prior Publication Data

US 2015/0063517 A1  Mar. 5, 2015

(51) Int. Cl.
*H03D 3/24* (2006.01)
*H04L 7/033* (2006.01)
*H04L 7/00* (2006.01)

(52) U.S. Cl.
CPC ............ *H04L 7/0331* (2013.01); *H04L 7/0079* (2013.01)

(58) Field of Classification Search
CPC ....... H04L 7/033; H03L 7/0891; H03L 7/093; H03L 7/087; H03L 7/18
USPC ........................................................ 375/376
See application file for complete search history.

(56) References Cited

U.S. PATENT DOCUMENTS

| | | | | |
|---|---|---|---|---|
| 5,126,854 A * | 6/1992 | Sano | ............................. | 386/204 |
| 5,179,729 A * | 1/1993 | Mishima et al. | .............. | 455/260 |
| 5,666,387 A * | 9/1997 | Tamamura et al. | ........... | 375/371 |
| 6,724,265 B2 * | 4/2004 | Humphreys | ..................... | 331/17 |
| 7,288,999 B1 * | 10/2007 | Hietala et al. | .................... | 331/23 |
| 7,412,215 B1 * | 8/2008 | Hietala et al. | ................. | 455/126 |
| 7,991,102 B2 * | 8/2011 | Chen et al. | ..................... | 375/376 |
| 8,384,453 B1 * | 2/2013 | Caviglia et al. | ............... | 327/156 |
| 2002/0190765 A1 * | 12/2002 | Matsunami et al. | .......... | 327/156 |
| 2004/0263223 A1 * | 12/2004 | Wong et al. | .................... | 327/156 |
| 2005/0185749 A1 * | 8/2005 | Convent et al. | ............... | 375/376 |
| 2006/0088126 A1 * | 4/2006 | Puma | ............................. | 375/302 |
| 2006/0170505 A1 * | 8/2006 | Humphreys et al. | ............ | 331/16 |
| 2006/0197613 A1 * | 9/2006 | Bunch et al. | ..................... | 331/16 |
| 2007/0103247 A1 * | 5/2007 | Yokota et al. | ................. | 331/158 |
| 2007/0146083 A1 * | 6/2007 | Hein et al. | ....................... | 331/16 |
| 2008/0094145 A1 | 4/2008 | Kuan et al. | | |
| 2012/0013406 A1 | 1/2012 | Zhu et al. | | |

OTHER PUBLICATIONS

Urbansky, R. et al. "Design Aspects and Analysis of SDH Equipment Clocks", European Transactions on Telecommunications, vol. 7, No. 1, pp. 39-48 (Jan. 1996).
Extended European Search Report for Patent Appln. No. 14176889.5 (Jan. 27, 2015).

* cited by examiner

*Primary Examiner* — Juan A Torres

(57) ABSTRACT

Various aspects of the present disclosure are directed apparatuses and methods including a first phase locked loop (PLL) circuit and a second PLL circuit. The first PLL circuit receives a carrier signal that is transmitted over a communications channel from a non-synchronous device, and generates a PLL-PLL control signal. The second PLL circuit receives a stable reference-oscillation signal, and, in response to the PLL-PLL control signal indicating a frequency offset, adjusts a fractional divider ratio of the second PLL circuit. The first PLL circuit and the second PLL circuit are configured to produce an output frequency signal that is synchronous to the carrier signal.

20 Claims, 5 Drawing Sheets

CLOCK SYNCHRONIZER FOR ALIGNING REMOTE DEVICES

FIELD OF THE INVENTION

Aspects of various embodiments of the present invention are directed to wireless power and data applications.

BACKGROUND OF THE INVENTION

Wireless communications have seen increasing use in a variety of fields and devices. For instance, identification products such as smart cards and RIFD (Radio Frequency Identification) tags are used widely in fields such as transport (e.g., ticketing, road tolling, baggage tagging), finance (e.g., debit and credit cards, electronic purses, merchant cards), communications (e.g., SIM cards for GSM (Global System for Mobile Communications) phones), and tracking (e.g., access control, inventory management, asset tracking) Many such applications involve products compliant with international standard ISO14443A identification cards, and provide RF (Radio Frequency) communication technology for transmitting data between a card or tag and a reader device. For example, in electronic ticketing for public transport, travelers can wave a card over a reader at turnstiles or other entry points, facilitating convenience and speed in the ticketing process.

Another type of wireless communication involves near-field communications (NFC), which is a type of contactless communications (e.g., for identification and networking technologies) that involves short-range wireless technology. Such applications often involve communication distances of a few centimeters, and have been used for secure communications between various devices without necessarily involving user configuration. In order to make two devices communicate, users bring them close together or even make them touch. The devices' NFC interfaces connect and configure themselves to form a peer-to-peer network. NFC can also bootstrap other wireless communication protocols, such as by exchanging the configuration and session data.

NFC communication devices can communicate using passive load-modulation (PLM) to communicate between a Tag/SmartCard Emulation (proximity integrated circuit card (PICC)) and a Reader/Writer (proximity coupling device (PCD)) by using a switch to vary antenna load, which is sensed by PCD. In instances where the PICC-side antenna is small, PLM may not be strong enough for the PCD to receive communications, and/or may not meet International Organization for Standardization (ISO) requirements. NFC communication devices can communicate using active load modulation (ALM) where there is active transmission of a signal back to the PCD from the PICC. While transmitting, the PICC can lose synchronization with the PCD field because the active modulation signal overwrites the PICC.

While wireless communications as discussed above have been useful, effecting such communication in an efficient, secure and reliable manner can be challenging. For example, data communications may be lost when a distance between devices is too great, or when communicated data becomes corrupt. These and other matters have presented challenges to different types of communications, for a variety of applications.

BRIEF SUMMARY OF THE INVENTION

Various example embodiments are directed to NFC communication devices and their implementation, and resolving the above-discussed issues and others.

Various aspects of the present disclosure are directed toward the use of a first phase locked loop (PLL) circuit and a second PLL circuit. The PLL circuitry would be included, for example, in a PCD. The first PLL circuit receives a carrier signal that is transmitted over a communications channel from a non-synchronous device (e.g., a PICC). Additionally, the first PLL circuit generates a PLL-PLL control signal, and observes a mode in which the carrier signal has inadequate signal quality. The second PLL circuit receives a stable reference-oscillation signal, and, in response to the PLL-PLL control signal indicating a frequency offset, adjusts a fractional divider ratio of the second PLL circuit.

In more specific embodiments, the first PLL circuit and the second PLL circuit are configured to produce an output frequency signal that is synchronous to the carrier signal. Additionally, in response to the mode being observed by the first PLL circuit, the first PLL circuit and the second PLL circuit suspend further adjustment of the PLL-PLL control signal. Further, the output frequency signal is synchronized to the carrier signal and concurrent with the mode being determined by the first PLL circuit, and synchronization is maintained via operation of the second PLL circuit. In certain embodiments, the second PLL circuit includes a post-divider circuit and a feedback path with a feedback divider circuit. Further, the post-divider circuit or the feedback divider circuit will adjust the fractional divider ratio of the second PLL circuit.

The above discussion/summary is not intended to describe each embodiment or every implementation of the present disclosure. The figures and detailed description that follow also exemplify various embodiments.

BRIEF DESCRIPTION OF THE DRAWINGS

Various example embodiments may be more completely understood in consideration of the following detailed description in connection with the accompanying drawings, in which.

DETAILED DESCRIPTION OF THE INVENTION

Figure 1:
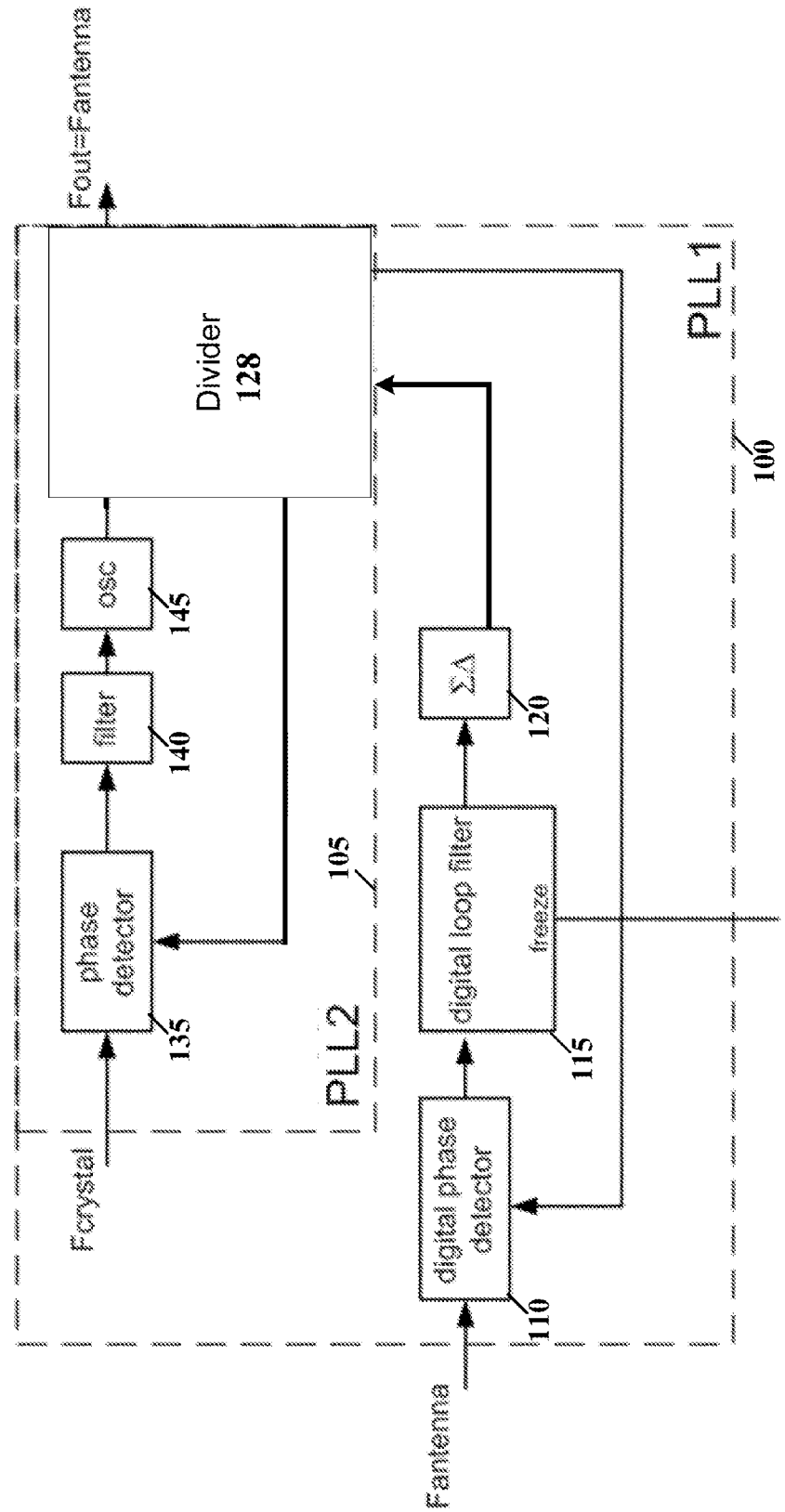
FIG. 1 shows an example two phase locked loop (PLL) circuit, consistent with various aspects of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention, including aspects defined in the claims. In addition, the term "example" as used throughout this application is only by way of illustration, and not limitation.

Aspects of the present invention are believed to be applicable to a variety of different types of devices, systems and arrangements for involving a clock synchronizer for aligning remote devices using near field communication. For instance, various aspects of the present disclosure include synchronized communication between a PCD and a PICC during an active load modulation process. While the present invention is not necessarily so limited, various aspects of the invention may be appreciated through a discussion of examples using this context.

Various example embodiments are directed to apparatuses and methods that address challenges, such as those identified in the background above. In accordance with one or more embodiments, apparatuses and methods include a first phase locked loop (PLL) circuit and a second PLL circuit. The first PLL circuit receives a carrier signal that is transmitted over a communications channel from a non-synchronous device (e.g., a PICC). Additionally, the first PLL circuit generates a PLL-PLL control signal, and observes a mode in which the carrier signal has inadequate signal quality. The second PLL circuit receives a stable reference-oscillation signal, and, in response to the PLL-PLL control signal indicating a frequency offset, adjusts a fractional divider ratio of the second PLL circuit.

Together, the first PLL circuit and the second PLL circuit produce an output frequency signal that is synchronous to the carrier signal. Additionally, in response to the mode being observed by the first PLL circuit, the first PLL circuit and the second PLL circuit suspend further adjustment of the PLL-PLL control signal. Further, the output frequency signal is synchronized to the carrier signal and concurrent with the mode being determined by the first PLL circuit; synchronization is maintained via operation of the second PLL circuit.

In certain embodiments, the second PLL circuit includes a post-divider circuit and a feedback path with a feedback divider circuit. Further, the post-divider circuit or the feedback divider circuit will adjust the fractional divider ratio of the second PLL circuit. Additionally, in certain embodiments, the second PLL circuit adjusts a fractional number by which the feedback divider circuit operates in response to the PLL-PLL control signal indicating the frequency offset, whereas in other embodiments, the second PLL circuit adjusts a fractional number by which the post-divider circuit operates in response to the PLL-PLL control signal indicating the frequency offset.

Additionally, in certain embodiments, the first PLL circuit also includes a modulation circuit and a phase detection circuit that detect a phase difference between the carrier signal and the output signal. Moreover, the modulation circuit responds to the phase detection circuit to provide a basis by which the first PLL circuit generates the PLL-PLL control signal. Apparatus and methods of the present disclosure can also include a PICC transmission circuit that uses the output signal as a carrier clock. Further, in certain embodiments, the first PLL circuit and the second PLL circuit suspend further adjustment in response to the PLL-PLL control signal during active transmission of the PICC transmission circuit.

Various aspects of the present disclosure are directed toward removing the inherent frequency difference between the PCD and the PICC-mode NFC device. Two phase-locked loop (PLL) circuits provide for a reserved time-slot before active load modulation starts, in order to acquire a fractional divider ratio that leads to an output frequency of the PLL equal to that of the PCD frequency. To determine this fractional divider ratio, the two phase-locked loop (PLL) circuits can use the PCD carrier (as available on the PICC-mode NFC device antenna) as a reference. The fractional divider ratio is controlled by one of the two phase-locked loop (PLL) circuits during acquisition. In the active load modulation phase, the fractional divider ratio is frozen such that the frequency delivered by the second PLL circuit remains substantially equal to the PCD frequency due to the PICC-mode NFC device's crystal frequency stability.

For various other embodiments, the skilled artisan will appreciate that the above-described aspects can be implemented to operate together. One or more of such variations can also apply to the related aspects described below in connection with the figures.

Turning now to the Figures, FIG. 1 shows an example two phase locked loop (PLL) circuit, consistent with various aspects of the present disclosure. A first PLL circuit 100 and a second PLL circuit 105 operate in conjunction and cooperatively to provide frequency stability in NFC communication between a PCD and PICC. The first PLL circuit 100 receives a carrier signal (e.g., $F_{antenna}$) that is transmitted over a communications channel from a non-synchronous device (e.g., a PICC). Additionally, the first PLL circuit 100 observes a mode in which the carrier signal has inadequate signal quality via, for example, a digital phase detector 110. The mode occurs and is detected when the PLL circuitry becomes asynchronous (e.g., non-matching clock signals) with the non-synchronous device. For instance, an indication from the external PCD can indicate that mode has occurred or is occurring.

The first PLL circuit 100 also includes a digital loop filter 115 and a sigma-delta modulator 120. The signal quality determined from the observation is passed from the digital phase detector 110 to the digital loop filter 115, which also receives a "freeze signal," which can be used to indicate the above noted mode. The first PLL circuit 100 generates a PLL-PLL control signal using the sigma-delta modulator 120, which includes an input from the digital loop filter 115. The sigma-delta modulator 120 sends/transmits the PLL-PLL control signal (shown by the dotted lines) to one of two circuits in the second PLL circuit 105.

In addition to receiving the PLL-PLL control signal, the second PLL circuit 105 also receives a stable reference-oscillation signal ($F_{crystal}$). The second PLL circuit 105 includes a phase detector 135 which is arranged to receive the reference-oscillation signal. Further, in response to the PLL-PLL control signal indicating a frequency offset, the second PLL circuit 105 adjusts a fractional divider ratio of the second PLL circuit 105. As noted above, the second PLL circuit 105 can accomplish this by using a feedback path with a divider circuit 128. The feedback path connects the feedback divider circuit 128 with the phase detector 135. The output of this phase detector is filtered using a filter block 140, and passed to an oscillator circuit 145, which is turn drives circuitry for the output of the second PLL circuit 105. Together, the first PLL circuit 100 and the second PLL circuit 105 cooperatively to produce an output frequency signal ($F_{out}$) that is synchronous to the carrier signal ($F_{antenna}$). Additionally, in response to the mode being observed by the first PLL circuit 100, the first PLL circuit 100 and the second PLL circuit 105 suspend further adjustment of the PLL-PLL control signal such that the output frequency signal ($F_{out}$) is synchronized to the carrier signal and concurrent with the mode being determined by the first PLL circuit 100, and synchronization is maintained via operation of the second PLL circuit 105.

Figure 2:
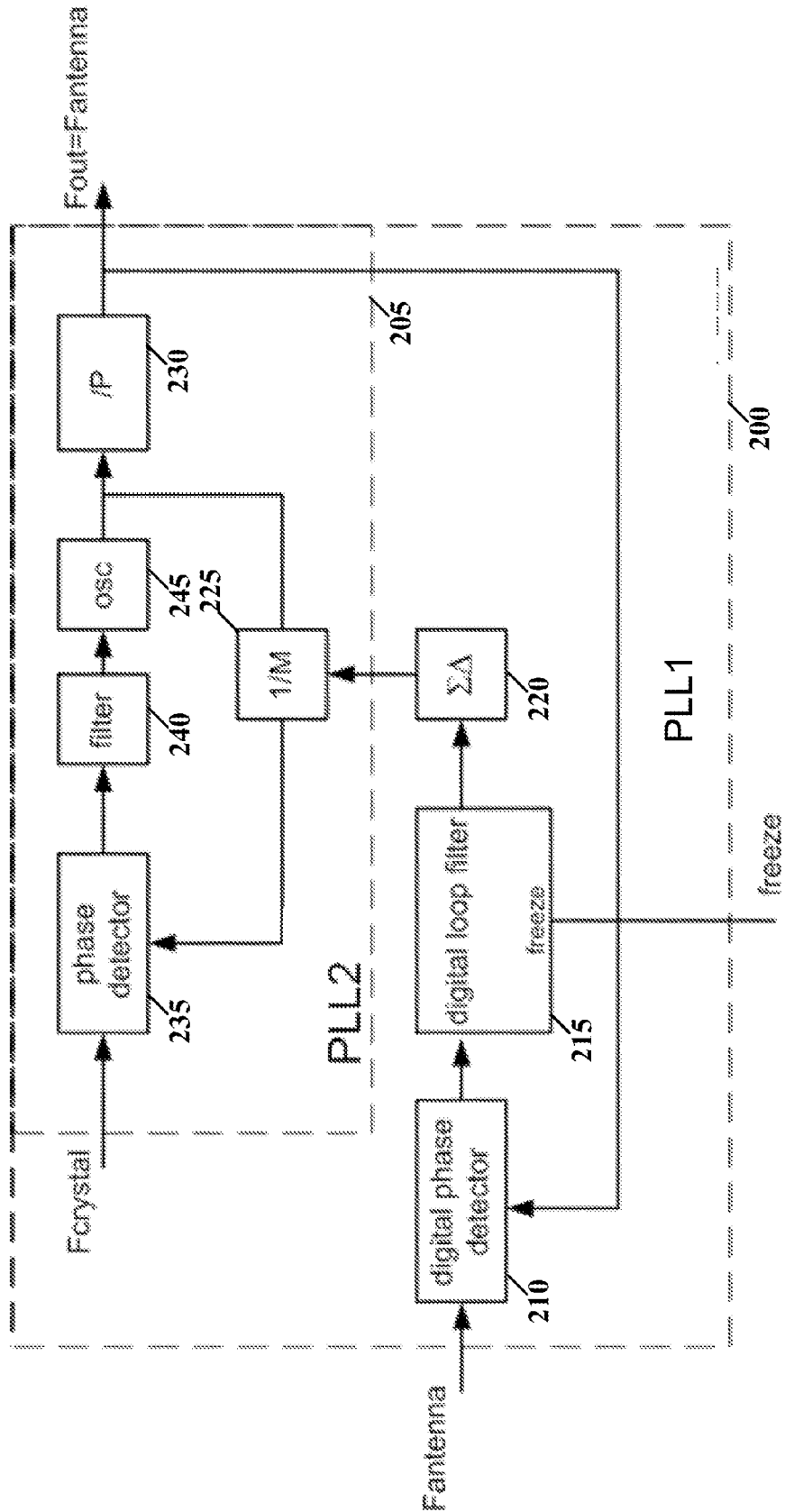
FIG. 2 shows an example two phase locked loop (PLL) circuit including a programmable-fractional divider circuit, consistent with various aspects of the present disclosure.

FIG. 2 shows an example two phase locked loop (PLL) circuit including a programmable-fractional divider circuit, also consistent with various aspects of the present disclosure. Similar to the above noted circuit-based building blocks in FIG. 1, the circuitry shown in FIG. 2 includes a first PLL circuit 200 and a second PLL circuit 205. The first PLL circuit 200 also includes a digital phase detector 210, a digital loop filter 215, and a sigma-delta modulator 220, all operating in a similar manner as those described in FIG. 1. The second PLL circuit 205 includes a feedback divider circuit 225, a post-divider circuit 230, a phase detector 235, a filter block 240, and an oscillator circuit 245, which are also configured to operate in a similar manner as those similarly arranged structures described in FIG. 1. As shown in FIG. 2, the sigma-delta modulator 220 is used to adjust a fractional divider ratio of the second PLL circuit 205. This occurs by adjusting a fractional number by which the feedback divider circuit 225 operates.

Figure 3:
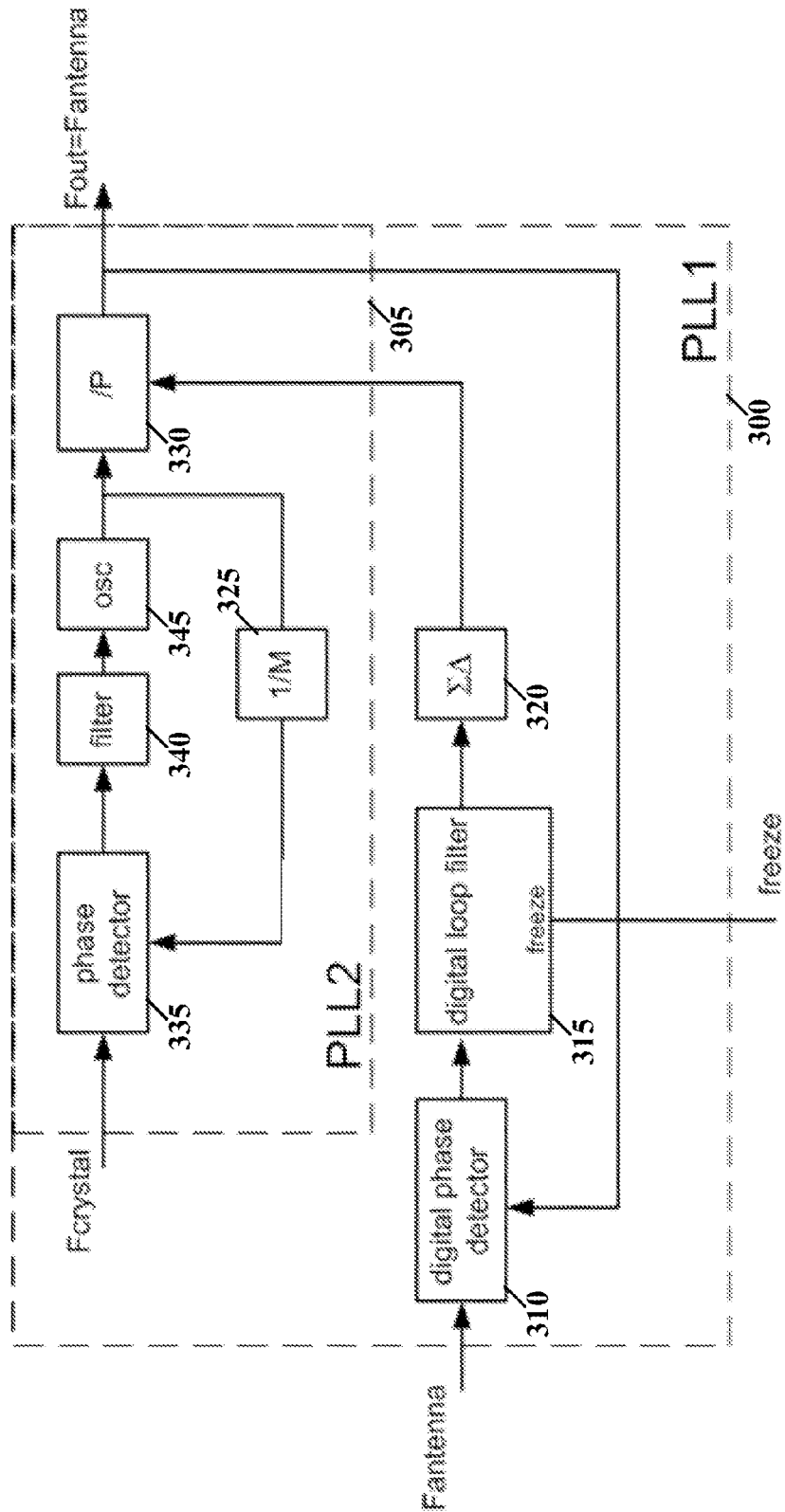
FIG. 3 shows another example two phase locked loop (PLL) circuit including a post-divider circuit, consistent with various aspects of the present disclosure.

FIG. 3 shows another example two phase locked loop (PLL) circuit including a post-divider circuit, consistent with various aspects of the present disclosure. Similar to the above noted circuit-based building blocks in FIG. 1, the circuitry shown in FIG. 3 includes a first PLL circuit 300 and a second PLL circuit 305. In this embodiment, the post-divider circuit 330 is adjusted. In this manner, the second PLL circuit 305 remains at a constant frequency, which is divided down by the post-divider circuit 330 in a fractional manner. Similar to FIG. 1 and FIG. 2, the first PLL circuit 300 also includes a digital phase detector 310, a digital loop filter 315, and a sigma-delta modulator 320; and the second PLL circuit 305 includes a feedback divider circuit 325, the post-divider circuit 330, a phase detector 335, a filter block 340, and an oscillator circuit 345. As this circuitry operates in a manner similar to the circuitry described in FIG. 1, and understanding of such operation is apparent from FIG. 1 in which the like reference numbers are used to depict corresponding aspects.

Figure 4:
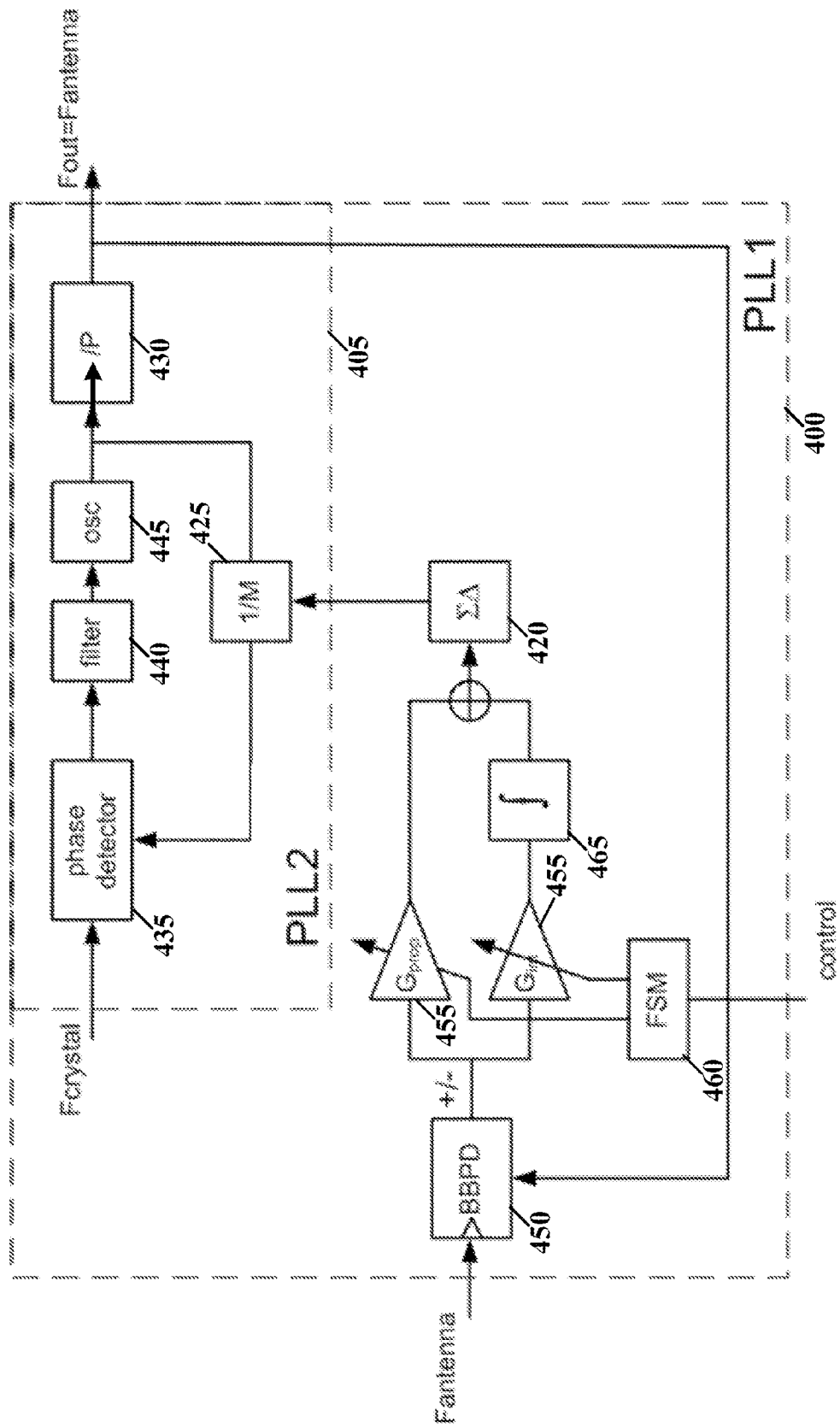
FIG. 4 shows another example two phase locked loop (PLL) circuit, consistent with various aspects of the present disclosure.

FIG. 4 shows another example two phase locked loop (PLL) circuit, consistent with various aspects of the present disclosure. Similar to FIGS. 1-3, the circuitry of FIG. 4 includes a first PLL circuit 400 and a second PLL circuit 405. The second PLL circuit 405 includes a feedback divider circuit 425, a post-divider circuit 430, a phase detector 435, a filter block 440, and an oscillator circuit 445. This circuitry operates in a manner similar to the circuitry described in FIG. 1. Additionally, the first PLL circuit 400 shows a more detailed version of the digital loop filter and digital phase detector circuits described above. The digital phase detector circuit uses a (bang-bang) phase detector 450, which can be implemented as a single D-flip-flop. The phase detector 450 provides a signal to two integrators 455, which are which are controlled by a finite state machine circuit 460. When the PLL-PLL control signal is adjusted, as described with reference to FIG. 1, the outputs of the integrators are equal to zero. The signal from one of the two integrators 455 is provided to a frequency filter block 465, and combined to provide a signal to a sigma-delta modulator 420.

Figure 5:
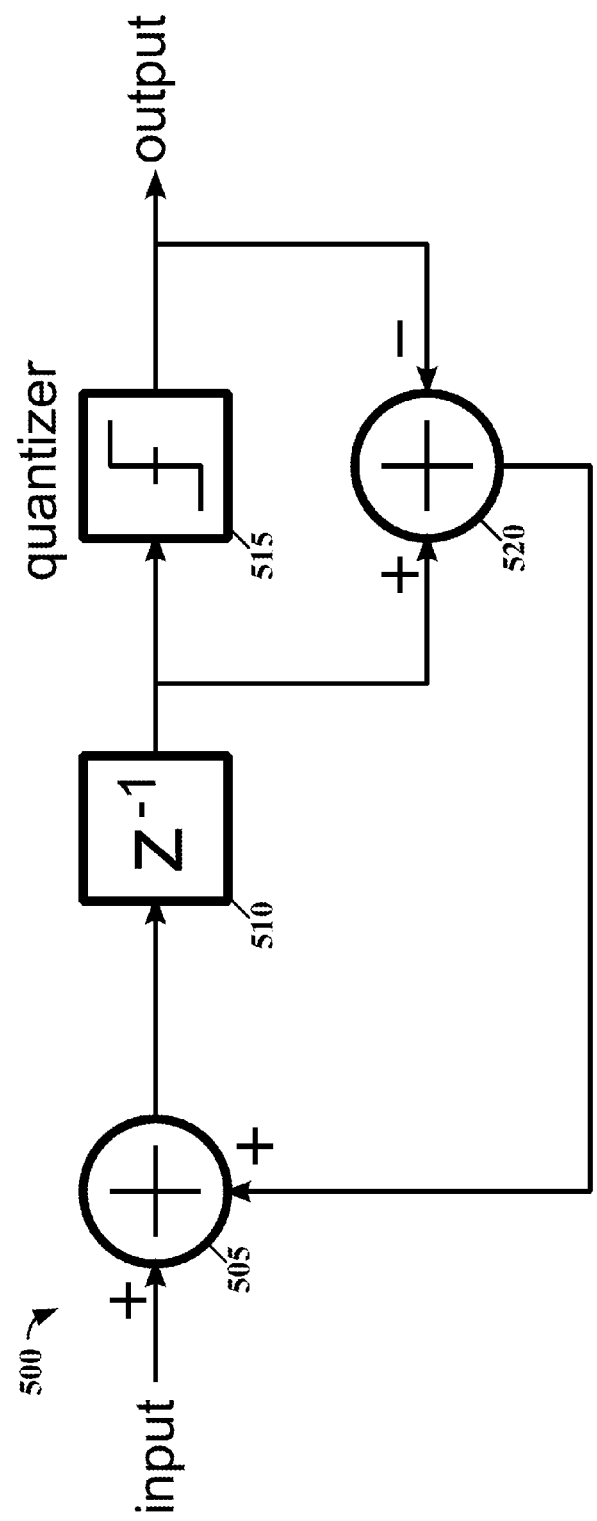
FIG. 5 shows an example implementation of a sigma-delta modulator, consistent with various aspects of the present disclosure.

FIG. 5 shows an example implementation of a sigma-delta modulator, consistent with various aspects of the present disclosure. The sigma-delta modulator 500 is a first-order sigma-delta modulator where the input signal comes into the sigma-delta modulator 500 via a summing junction 505. The summing junction 505 is connected, via a memory element (or module) 510, to a quantizer 515. The incoming sample and the output of summing junction 520 are summed at summing junction (or module) 505. Summing junction 520 determines the rounding error made by the quantizer. This rounding error is then taken into account in the determination of the next output bit in such a way that the rounding errors average out to zero. In this manner, the output of the sigma-delta modulator, in the simplest case, is a single bit that provides one of two divider ratios (as described above) with an average value equal to the multi-bit input.

Various circuit-based building blocks and/or other modules may be implemented to carry out one or more of the operations and activities described herein and/or shown in the Figures. In such contexts, the illustrated/described "block" or "module" correspond to circuitry that carries out one or more of these or related operations/activities. For example, in certain of the above-discussed embodiments, one or more blocks are discrete logic circuits or programmable logic circuits configured and arranged for implementing these operations/activities, as in the circuit modules shown in the Figures, such as the filter block or phase detector block shown in FIG. 1. In certain embodiments, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Based upon the above discussion and illustrations, those skilled in the art will readily recognize that various modifications and changes may be made without strictly following the exemplary embodiments and applications illustrated and described herein. Furthermore, various features of the different embodiments may be implemented in different combinations. Such modifications do not depart from the true spirit and scope of the present disclosure, including those set forth in the following claims.

What is claimed is:

1. An apparatus comprising:
   (a) a first phase locked loop (PLL) circuit configured and arranged to
      receive a carrier signal that is transmitted over a communications channel from a non-synchronous device,
      generate a PLL-PLL control signal, and
      observe a mode in which the carrier signal has inadequate signal quality;
   (b) a second PLL circuit configured and arranged to
      receive a stable reference-oscillation signal, and
      adjust, in response to the PLL-PLL control signal indicating a frequency offset, a fractional divider ratio of the second PLL circuit; and
   (c) the first PLL circuit and the second PLL circuit being further configured and arranged to produce an output frequency signal that is synchronous to the carrier signal and, in response to the mode being observed by the first PLL circuit, to suspend further adjustment of the PLL-PLL control signal, wherein the output frequency signal is synchronized to the carrier signal and concurrent with the mode being determined by the first PLL circuit, synchronization is maintained via operation of the second PLL circuit.

2. The apparatus of claim 1, wherein the second PLL circuit includes a post-divider circuit and a feedback path with a feedback divider circuit therein, and wherein the post-divider circuit or the feedback divider circuit are configured and arranged to adjust the fractional divider ratio of the second PLL circuit.

3. The apparatus of claim 1, wherein the second PLL circuit includes a feedback path with a feedback divider circuit therein, and the second PLL circuit is further configured and arranged to adjust a fractional number by which the feedback divider circuit operates, in response to the PLL-PLL control signal indicating the frequency offset.

4. The apparatus of claim 1, wherein the second PLL circuit includes a post-divider circuit, and the second PLL circuit is further configured and arranged to adjust a fractional number by which the post-divider circuit operates in response to the PLL-PLL control signal indicating the frequency offset.

5. The apparatus of claim 1, wherein the second PLL circuit includes a post-divider circuit and a feedback path with a feedback divider circuit therein, and the second PLL circuit is further configured and arranged to adjust a fractional number by which the post-divider circuit or the feedback divider circuit operates in response to the PLL-PLL control signal indicating the frequency offset.

6. The apparatus of claim 1, wherein the first PLL circuit includes a modulation circuit and a phase detection circuit configured and arranged to detect a phase difference between the carrier signal and the output signal, and the modulation circuit is configured and arranged to respond to the phase detection circuit to provide a basis by which the first PLL circuit generates the PLL-PLL control signal.

7. The apparatus of claim 1, further including an active proximity integrated circuit card (PICC) transmission circuit and wherein the active PICC transmission circuit is configured and arranged to utilize the output signal as a carrier clock.

8. The apparatus of claim 1, further including an active PICC transmission circuit and wherein the active PICC transmission circuit is configured and arranged to utilize the output signal as a carrier clock and wherein the first PLL circuit and the second PLL circuit are further configured and arranged to suspend further adjustment in response to the PLL-PLL control signal during active transmission of the PICC transmission circuit.

9. The apparatus of claim 1, wherein the first PLL circuit includes a phase detection circuit configured and arranged to detect a phase difference between the carrier signal and the output frequency signal.

10. An apparatus comprising:
(a) a first phase locked loop (PLL) circuit configured and arranged to
receive a carrier signal that is transmitted over a communications channel from a non-synchronous device,
generate a PLL-PLL control signal, and
observe a mode in which the carrier signal has inadequate signal quality;
(b) a second PLL circuit including a post-divider circuit and a feedback path with a feedback divider circuit therein, the second PLL circuit being configured and arranged to
receive a stable reference-oscillation signal, and
adjust, in response to the PLL-PLL control signal indicating a frequency offset, a fractional number by which the feedback divider circuit or the post-divider circuit operates; and
(c) the first PLL circuit and the second PLL circuit being further configured and arranged to produce an output frequency signal that is synchronous to the carrier signal and, in response to the mode being observed by the first PLL circuit, to suspend further adjustment of the PLL-PLL control signal, wherein the output frequency signal is synchronized to the carrier signal and concurrent with the mode being determined by the first PLL circuit, synchronization is maintained via operation of the second PLL circuit.

11. The apparatus of claim 10, wherein the first PLL circuit includes a phase detection circuit configured and arranged to detect a phase difference between the carrier signal and the output frequency signal.

12. The apparatus of claim 10, wherein the first PLL circuit includes a modulation circuit and a phase detection circuit configured and arranged to detect a phase difference between the carrier signal and the output frequency signal, and the modulation circuit is configured and arranged to respond to the phase detection circuit to provide a basis by which the first PLL circuit generates the PLL-PLL control signal.

13. The apparatus of claim 10, further including an active PICC transmission circuit and wherein the active PICC transmission circuit is configured and arranged to utilize the output signal as a carrier clock.

14. The apparatus of claim 10, further including an active PICC transmission circuit and wherein the active PICC transmission circuit is configured and arranged to utilize the output signal as a carrier clock, and wherein the first PLL circuit and the second PLL circuit are further configured and arranged to suspend further adjustment in response to the PLL-PLL control signal during active transmission of the PICC transmission circuit.

15. The apparatus of claim 11, wherein the output frequency signal is synchronized to the carrier signal by frequency and phase via the phase detection circuit.

16. A method comprising:
receiving a carrier signal, at a first phase locked loop (PLL) circuit, that is transmitted over a communications channel from a non-synchronous device;
generating a PLL-PLL control signal using the first PLL circuit;
observing a mode, using the first PLL circuit, in which the carrier signal has inadequate signal quality;
receiving, at a second PLL circuit including a post-divider circuit and a feedback path with a feedback divider circuit therein, a stable reference-oscillation signal;
adjusting, in response to the PLL-PLL control signal indicating a frequency offset, a fractional number by which the feedback divider circuit or the post-divider circuit operates; and
producing an output frequency signal, using the first PLL circuit and the second PLL circuit, that is synchronous to the carrier signal and, in response to the mode being observed, suspending further adjustment in response to the PLL-PLL control signal, wherein the output frequency signal is synchronized to the carrier signal and concurrent with the mode, synchronization is maintained via operation of the second PLL circuit.

17. The method of claim 16, further including detecting a phase difference between the carrier signal and the output frequency signal.

18. The method of claim 16, further including utilizing the output signal as a carrier clock for an active PICC transmission circuit.

19. The method of claim 16, further including utilizing the output signal as a carrier clock for an active PICC transmission circuit and suspending further adjustment in response to the PLL-PLL control signal during active transmission of the PICC transmission circuit.

20. The method of claim 16, further including detecting a phase difference between the carrier signal and the output frequency signal and utilizing the output signal as a carrier clock for an active PICC transmission circuit.

\* \* \* \* \*